United States Patent
Murota et al.

(10) Patent No.: US 9,558,303 B2
(45) Date of Patent: Jan. 31, 2017

(54) TOOL GRAVITY CENTER POSITION ESTIMATION DEVICE AND MACHINE TOOL

(71) Applicant: FANUC Corporation, Yamanashi (JP)

(72) Inventors: Masahiro Murota, Yamanashi (JP); Gaku Isobe, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 216 days.

(21) Appl. No.: 14/583,078

(22) Filed: Dec. 24, 2014

(65) Prior Publication Data

US 2015/0186556 A1 Jul. 2, 2015

(30) Foreign Application Priority Data

Dec. 27, 2013 (JP) .................................. 2013-272509

(51) Int. Cl.
*G06F 17/50* (2006.01)

(52) U.S. Cl.
CPC .................................... *G06F 17/50* (2013.01)

(58) Field of Classification Search
CPC ....................................................... G06F 17/50
USPC ............................................................. 703/1
See application file for complete search history.

(56) References Cited

U.S. PATENT DOCUMENTS 6,098,025 A * 8/2000 Bae ......................... G01M 1/10
  33/398
2013/0234643 A1 9/2013 Shibata et al.

FOREIGN PATENT DOCUMENTS

| JP | 5-138502 A | 6/1993 |
|---|---|---|
| JP | 8-190433 A | 7/1996 |
| JP | 11-188556 A | 7/1999 |
| JP | 11-188557 A | 7/1999 |
| JP | 3187485 A | 7/2001 |
| JP | 2003-99479 A | 4/2003 |
| JP | 2006-68901 A | 3/2006 |
| JP | 2007-264749 A | 10/2007 |
| JP | 2009-178795 A | 8/2009 |
| JP | 2012-115912 A | 6/2012 |
| JP | 2013-186545 A | 9/2013 |

OTHER PUBLICATIONS

Decision to Grant a Patent mailed Apr. 28, 2015, corresponding to Japanese patent application No. 2013-272509.

* cited by examiner

*Primary Examiner* — Saif Alhija
(74) *Attorney, Agent, or Firm* — Hauptman Ham, LLP

(57) ABSTRACT

A value of shape data is calculated from moment of inertia and weight data of a tool, a relational expression between shape data and tool moment of inertia in a predetermined tool shape model, and a relational expression between the shape data and tool weight in the tool shape model to estimate a shape of the tool, and a gravity center position of the tool is calculated based on the estimated tool shape.

10 Claims, 3 Drawing Sheets

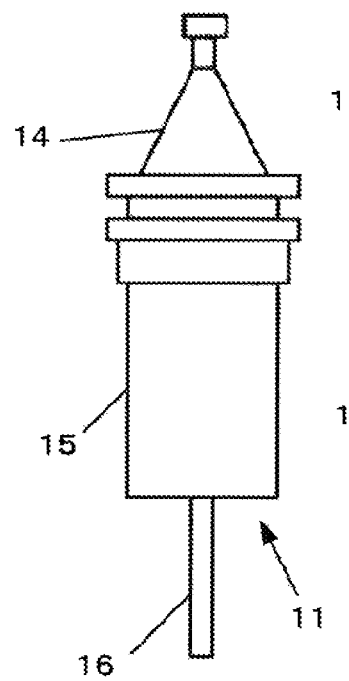
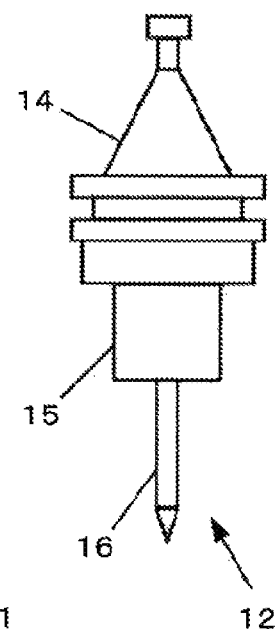
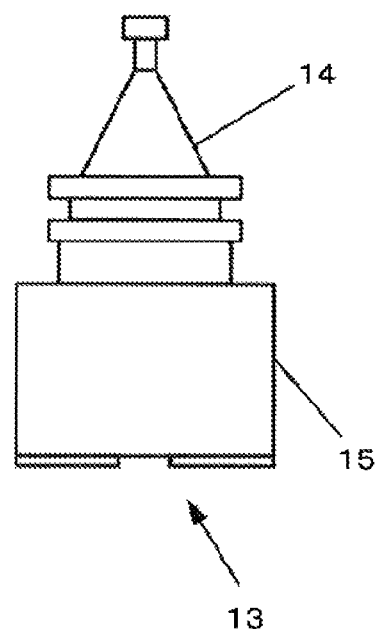
FIG. 1A  FIG. 1B  FIG. 1C
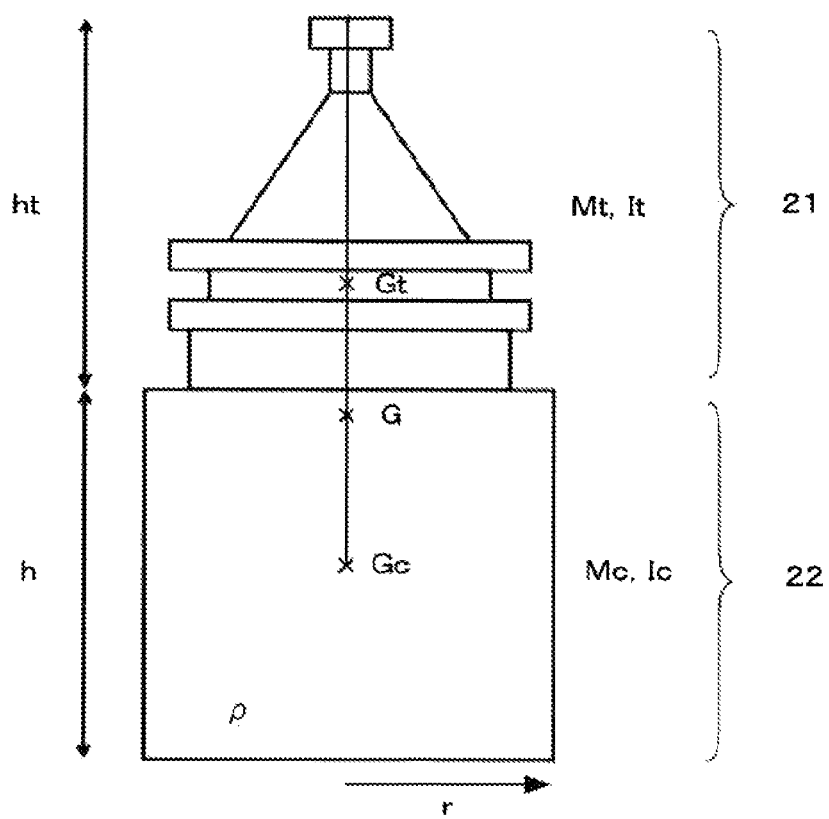
FIG. 2

TOOL GRAVITY CENTER POSITION ESTIMATION DEVICE AND MACHINE TOOL

RELATED APPLICATIONS

The present application claims priority to Japanese Application Number 2013-272509, filed Dec. 27, 2013, the disclosure of which is hereby incorporated by reference herein in its entirety.

BACKGROUND OF THE INVENTION

Field of the Invention

The present invention relates to a tool gravity center position estimation device that estimates a gravity center position of a tool and a machine tool using the estimated tool gravity center position.

Description of the Related Art

Conventionally, there is known a machine tool having a function of changing an operating speed of a tool changer according to a weight of an attached tool. Such a machine tool uses this function to operate the tool changer at an optimum speed, which allows the machine tool to be driven at a sufficient speed while suppressing an impact on the machine or heat generation from a motor.

Further, there is known a machine tool having a function of estimating moment of inertia of a spindle upon attachment of a tool from acceleration of the spindle upon rotation thereof. The function of estimating moment of inertia of a spindle of such a machine tool allows operation of the spindle to be controlled appropriately according to the moment of inertia of the tool.

JP 11-188557 A discloses a changing arm type tool changer capable of shortening tool change time by detecting a drive torque required to rotate a changing arm that holds a tool, estimating a weight of the tool from the detected drive torque, and automatically setting an operating speed of the changing arm based on the estimated tool weight.

JP 05-138502 A discloses a numeric-control machine tool that detects, when a constant power is supplied to a spindle rotating motor, a time required for a spindle rotating speed to reach a certain set value to calculate moment of inertia of a spindle and compares the calculated moment of inertia with a spindle rotating speed command value to determine whether or not the spindle can be rotated as instructed.

JP 2013-186545 A discloses a spindle positioning device that estimates moment of inertia of a spindle from a magnetic flux density command to be issued to a motor and a magnetic flux density estimation value, and a motor speed, and changes an output command value to be issued to the motor according to the estimated moment of inertia.

A device that changes an operating speed of a machine according to a tool weight, like the tool changer disclosed in JP 11-188557 A, can be driven while suppressing an impact on the machine or heat generation from a motor; however, sometimes the impact on the machine or a load on the motor cannot be estimated accurately only with information of the tool weight.

Further, the devices disclosed in respective JP 05-138502 A and JP 2013-186545 A can control the operating speed of a motor for the spindle by calculating the moment of inertia of the spindle; however, also in this configuration, sometimes the impact on the machine or a load on the motor cannot be estimated accurately only with information of the moment of inertia of the spindle.

In order to estimate the impact on the machine or load on the motor more accurately, it is preferable to use not only the tool weight or moment of inertia, but also information of a gravity center position of the tool. However, it is troublesome for a user to measure or calculate the gravity center position of each tool in advance, which may make it difficult to use the gravity center position information of the tool so as to perform appropriate operation setting of the machine tool.

SUMMARY OF THE INVENTION

An object of the present invention is therefore to provide a tool gravity center position estimation device and a machine tool capable of estimating a gravity center position of a tool used in a machine tool so as to perform appropriate operation setting of the machine tool.

A tool gravity position estimation device according to the present invention includes a data storage unit configured to store moment of inertia of a tool and weight data of the tool, a relational expression storage unit configured to store a relational expression between shape data and tool moment of inertia in a predetermined tool shape model and a relational expression between the shape data and tool weight data in the predetermined tool shape model, a calculation unit configured to calculate a value of the shape data based on the tool moment of inertia and tool weight data stored in the data storage unit and the relational expressions stored in the relational expression storage unit, a tool shape estimation unit configured to estimate a shape of the tool from the shape data value calculated by the calculation unit, and a tool gravity center position calculation unit that calculates a gravity center position of the tool based on the tool shape estimated by the tool shape estimation unit.

The shape data value in the tool shape model is calculated based on the tool moment of inertia and tool weight to thereby estimate a tool shape from the shape data value, and the gravity center position of the tool is calculated based on the estimated tool shape. As a result, an impact applied to a machine tool at its operation time can be estimated more accurately than in the case where it is estimated only from the tool weight data.

The tool shape model may include a tool holder portion which is a common part of a plurality of tools to be modeled and a columnar portion different in diameter and height for each tool to be modeled.

By estimating the shape of the tool shape model assumed to have the tool holder portion and columnar portion, the tool gravity center position can be estimated from the tool moment of inertia and tool weight data.

The tool shape model may include a tool holder portion which is a common part of a plurality of tools to be modeled, a columnar portion different in diameter and height for each tool to be modeled, and a blade portion different in shape for each tool to be modeled, and the calculation unit may calculate the shape data value of the tool shape model based on tool length and tool diameter data in addition to the tool moment of inertia and tool weight data.

By estimating the shape of the tool shape model assumed to have the blade portion, in addition to the tool holder portion and columnar portion based on the tool length and tool diameter data, in addition to the tool moment of inertia and tool weight data, the tool shape and tool gravity center position can be estimated more accurately.

A machine tool according to the present invention is provided with a spindle and a spindle motor for rotating the spindle and includes, a machine tool data storage unit configured to store moment of inertia of the spindle of the machine tool, a torque detection unit configured to detect a load torque of the spindle motor, an angular acceleration detection unit configured to detect an angular acceleration of rotation of the spindle, a tool moment of inertia estimation unit configured to estimate moment of inertia of a tool by subtracting the moment of inertia of the spindle to which the tool is not attached, stored in the machine tool data storage unit from moment of inertia of the spindle to which the tool is attached, estimated based on the load torque detected by the torque detection unit and angular acceleration detected by the angular acceleration detection unit, a data storage unit configured to store weight data of the tool and the moment of inertia of the tool, a relational expression storage unit configured to store a relational expression between shape data and tool moment of inertia in a predetermined tool shape model and a relational expression between the shape data and tool weight data in the predetermined tool shape model, a calculation unit configured to calculate a value of the shape data based on the tool moment of inertia and tool weight data stored in the data storage unit and the relational expressions stored in the relational expression storage unit, a tool shape estimation unit configured to estimate a shape of the tool from the shape data value calculated by the calculation unit, and a tool gravity center position calculation unit that calculates a gravity center position of the tool based on the tool shape estimated by the tool shape estimation unit.

By estimating the tool moment of inertia from the load torque of the spindle motor and angular acceleration of the spindle, it is possible to provide a machine tool capable of estimating the tool shape or tool gravity center position without directly inputting data of the tool moment of inertia.

The tool shape model may include a tool holder portion which is a common part of a plurality of tools to be modeled and a columnar portion different in diameter and height for each tool to be modeled.

By estimating the shape of the tool shape model assumed to have the tool holder portion and columnar portion, it is possible to provide a machine tool capable of estimating the tool gravity center position from the tool moment of inertia and tool weight data.

The tool shape model may include a tool holder portion which is a common part of a plurality of tools to be modeled, a columnar portion different in diameter and height for each tool to be modeled, and a blade portion different in shape for each tool to be modeled, and the calculation unit may calculate the shape data value of the tool shape model based on tool length and tool diameter data in addition to the tool moment of inertia and tool weight data.

By estimating the shape of the tool shape model assumed to have the blade portion, in addition to the tool holder portion and columnar portion based on the tool length and tool diameter data, in addition to the tool moment of inertia and tool weight data, it is possible to provide a machine tool capable of estimating the tool shape and tool gravity center position more accurately.

The machine tool may include a tool magazine that can hold, at tool holding portions thereof, a plurality of tools to be attached/detached to/from the spindle, the tool holding portions being assigned with identification symbols identifiable from each other, and the machine tool may further include a tool shape data storage unit configured to store therein the tool shape estimated by the tool shape estimation unit in association with the identification symbol.

By assigning the identification symbols identifiable from each other to the tools and associating the estimated tool shape with the identification symbol, the tool shape data can be created for each identification symbol of the tool.

The machine tool may include a tool magazine that can hold, at tool holding portions thereof, a plurality of tools to be attached/detached to/from the spindle is provided, the tool holding portions being assigned with identification symbols identifiable from each other, and the machine tool may further include a tool gravity center position data storage unit configured to store therein the tool gravity center position calculated by the tool gravity center position calculation unit in association with the identification symbol.

By associating the estimated tool gravity center position with the identification symbol, the tool gravity center position data can be created for each identification symbol of the tool. As a result, it is possible to perform appropriate operation setting of a tool changer based on the tool gravity center position data.

The machine tool may display a message or issue an alarm when the tool shape estimated by the tool shape estimation unit falls outside a prescribed limited range of dimension.

By displaying the message or issuing the alarm when the tool shape estimated by the tool shape estimation unit falls outside the prescribed limited range of dimension, it is possible to prevent occurrence of interfere from the tool or occurrence of a failure of the machine.

The machine tool may include a tool shape comparison unit configured to compare the tool shape estimated by the tool shape estimation unit with the tool weight data and tool moment of inertia stored in the data storage unit and may display a message or issue an alarm when a difference obtained as a result of the comparison by the tool shape comparison unit is equal to or larger than a certain value.

By notifying, upon estimation of the tool shape, a user of a change from the previously estimated tool shape stored in the data storage unit, it is possible to make the user confirm whether the tool is changed or not and to inform the user of occurrence of any abnormality in the tool or machine tool.

According to the above configuration, there can be provided a tool gravity center position estimation device and a machine tool capable of estimating the gravity center position of a tool used in a machine tool so as to perform appropriate operation setting of the machine tool.

BRIEF DESCRIPTION OF THE DRAWINGS

The above and other objects and features of the present invention will be more apparent from the following description taken in conjunction with the accompanying drawings in which:

FIGS. 1A to 1C are views each schematically illustrating a tool used in an embodiment of the present invention;

FIG. 2 is a view illustrating a tool shape model in the embodiment of the present invention;

DETAILED DESCRIPTION OF THE PREFERRED EMBODIMENTS

Figure 3:
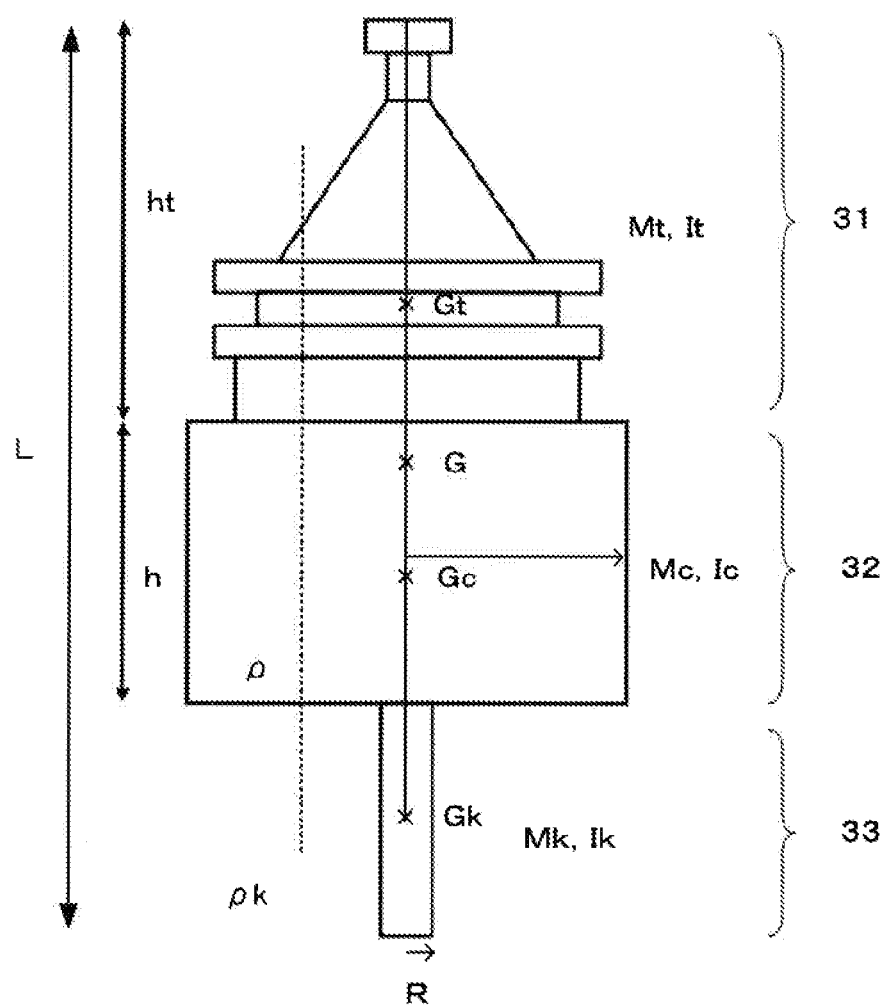
FIG. 3 is a view illustrating another tool shape model in the embodiment of the present invention.

First, a method of estimating a shape of a tool based on moment of inertia and a weight of the tool and then calculating a gravity center position will be described. FIGS. 1A to 1C are views schematically illustrating some types of tools. FIG. 1A illustrates a milling tool 11, FIG. 1B is a drilling tool 12, and FIG. 1C illustrates a milling cutter tool 13. The above tools 11 to 13 have tool holder portions 14 having substantially the same shape. Further, the milling tool 11 and drilling tool 12 each have, at their leading ends, a blade portion 16.

Although a part (i.e.,) to be fitted to the tool holder portion 14 differs in height or width depending on a type of the tool, a portion to be fitted with the blade portion 16 in the tools 11, 12 and the tool 13 itself generally has a substantially columnar shape. Hereinafter, the portion having the substantially columnar shape is referred to as "columnar portion 15". The blade portion 16 in the milling tool 11 and drilling tool 12 are considerably smaller in weight and inertial moment about a rotation axis than other portions, so that when the tool gravity center position is roughly estimated, it is possible to ignore the blade portion 16.

Thus, the milling tool 11, drilling tool 12, and milling cutter tool 13 illustrated in FIG. 1 can be considered as a tool shape model including a tool holder portion 21 and a columnar portion 22 as illustrated in FIG. 2.

Next, a shape of the tool is estimated based on this tool shape model.

Assuming that a density, a radius, and a height of the columnar portion 22 are $\rho$, $r$, and $h$, respectively, a weight $M_c$ of the columnar portion 22 and moment of inertia $I_c$ of the columnar portion about a rotating axis are calculated as follows:

$$M_c = \rho \pi r^2 h \qquad (1)$$

$$I_c = \frac{1}{2} \rho \pi r^4 h \qquad (2)$$

Further, assuming that a weight of the entire tool is M and moment of inertia of the entire tool around the rotating axis is I, and that a weight of the tool holder portion 21 is $M_t$ and moment of inertia of the tool holder portion 21 about the rotating axis is $I_t$, M and I are calculated as follows:

$$M = M_t + M_c \qquad (3)$$

$$I = I_t + I_c \qquad (4)$$

The tool holder portion 21 is a common part, so that it is possible to define in advance values of $M_t$ and $I_t$ by measuring a detailed dimension and weight thereof.

From the above expressions, r and h can be calculated as follows:

$$r = \sqrt{\frac{2(M - M_t)}{I - I_t}} \qquad (5)$$

$$h = \frac{M - M_t}{\rho \pi r^2} \qquad (6)$$

By calculating r and h of the columnar portion 22 in this manner, it is possible to estimate the tool shape. Here, the tool shape is estimated assuming that the density $\rho$ of the columnar portion 22 of the tool is known; however, when the density $\rho$ is not known, r and h can be calculated assuming that the tool height is h, and that the actual height and the like of the tool are known.

Next, the gravity center position of the tool is estimated from the tool shape estimated in this manner.

Assuming that a distance from a tip end of a pull stud of the tool to the gravity center of the tool holder portion 21 is $G_t$ and a distance from the pull stud tip end to the gravity center of the columnar portion 22 is $G_c$, a distance G from the pull stud tip end to the gravity center of the entire tool including the tool holder portion 21 and columnar portion 22 can be calculated by the following expression:

$$G = \frac{G_t M_t + G_c M_c}{M_t + M_c} \qquad (7)$$

It is assumed here that the tool holder portion 21 in all the tools and that the value $G_t$ is previously set as a common value. Further, assuming that a length of the tool holder portion 21 is ht, the gravity center position $G_c$ and weight $M_c$ of the columnar portion 22 are calculated as follows:

$$G_c = h_t + \frac{h}{2} \qquad (8)$$

$$M_c = M - M_t \qquad (9)$$

As a result, it is possible to estimate the gravity center position of the entire tool based on the estimated tool shape.

In the above estimation method of the gravity center position of the entire tool, the tool shape is estimated with the shape of the tool blade potion ignored; however, when there is available data of a tool diameter, i.e. diameter of the blade portion, and a tool length, i.e. tool entire length including the blade portion, it is possible to estimate the gravity center position of the entire tool more accurately by using a tool shape model including the blade portion.

In this case, the gravity center position of the entire tool is estimated using a tool shape model illustrated in FIG. 3. A reference numeral 31 denotes a tool holder portion and a reference numeral 32 is a columnar portion.

Assuming that a diameter of the blade portion 33 is R and the tool length is L, a weight $M_k$ of the blade portion 33 and moment of inertia $I_k$ of the blade portion 33 about the rotating axis are calculated as follows:

$$M_k = \rho_k \pi R^2 (L - h_t - h) \qquad (10)$$

$$I_k = \frac{1}{2} \rho_k \pi R^4 (L - h_t - h)$$

By using the weight $M_k$ and moment of inertia $I_k$ about the rotating axis, M and I are calculated as follows:

$$M = M_t + M_c + M_k \qquad (11)$$

$$I = I_t + I_c + I_k \qquad (12)$$

Then, as in the case of the tool shape model of FIG. 2, h and r are calculated by using the values of the thus calculated M and I to estimate the tool shape, and then the gravity center position and weight are calculated for each part of the tool, thereby allowing the gravity center position of the entire tool to be estimated.

As described above, the use of the device that estimates the gravity center position of the tool allows estimation of the tool gravity position from basic data such as the moment of inertia and weight of the tool.

When the thus configured tool gravity center position estimation device is mounted to a machine tool, it is possible to estimate a value of the moment of inertia of the tool from a torque and an angular speed of a spindle motor in place of inputting the moment of inertia of the tool. The following describes an estimation method of the moment of inertia in this case.

Figure 4:
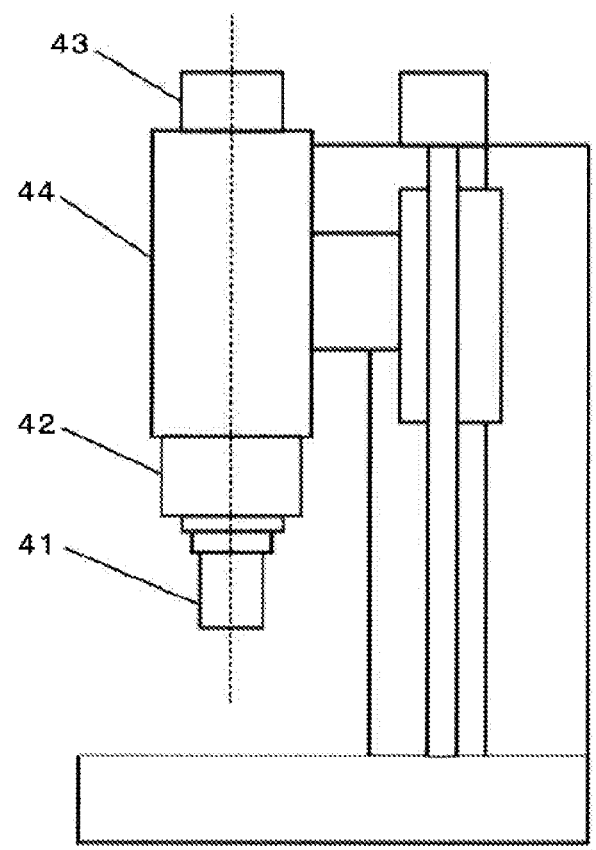
FIG. 4 is a view illustrating an example of a machine tool in the embodiment of the present invention.

FIG. 4 is a view illustrating an example of a machine tool. Reference numerals 41, 42, 43, and 44 denote a tool, a spindle, a spindle motor and a spindle rotating axis, respectively. The tool 41 is attached to the spindle 42 and rotated by the spindle motor 43, whereby machining is performed.

First, the moment of inertia of the tool 41 around the spindle 42 is estimated from a torque T and an angular speed α of the spindle motor 43 upon rotation of the spindle 42. Assuming that the moment of inertia of the spindle 42 is $I_s$ and the moment of inertia of the tool is I, the following expressions are satisfied:

$$T = (I_s + I)\alpha \tag{13}$$

$$I = \frac{T}{\alpha} - I_s \tag{14}$$

In this manner, the moment of inertia of the tool 41 about the spindle 42 can be estimated.

Also in a machine tool having a speed reducing function between the spindle motor 43 and spindle 42, it is possible to calculate a torque applied to the spindle by multiplying the torque of the spindle motor 43 by a reduction ratio, and the moment of inertia of the tool can be estimated using the calculated torque value.

It is possible to perform appropriate operation setting of the machine tool by using the thus estimated tool shape and gravity center position as follows, for example.

Figure 5:
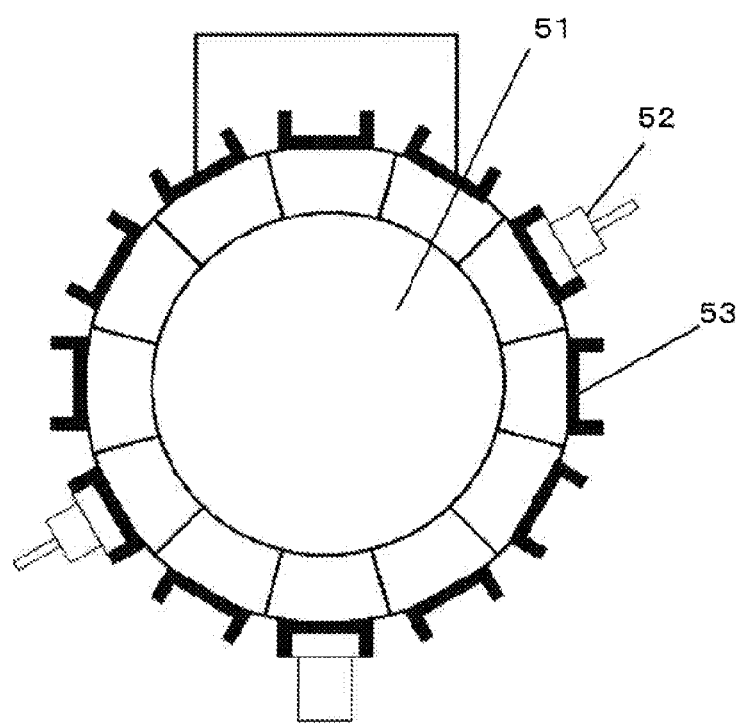
FIG. 5 is a view illustrating a tool changer provided with a revolving tool magazine to which the present invention is applied.

FIG. 5 illustrates a tool changer provided with a revolving tool magazine. In FIG. 5, a reference numeral 51 denotes a tool magazine, a reference numeral 52 denotes a tool attached to the tool magazine 51, and a reference numeral 53 denotes a tool holding portion capable of holding the tool 52. For the tool 52 to be attached to the tool magazine 51, the tool shape and tool gravity center position is previously estimated by the above-described estimation method and stored as tool shape data or tool gravity center position data in association with a tool number assigned to the tool holding portion 53 of the tool magazine 51 by which the tool 52 is held.

Thus, by using the stored tool shape data and tool gravity center position data of each tool 52, a weight of each tool 52, and a distance from a revolving center of the tool magazine 51 to the tool gravity center position, it is possible to calculate the moment of inertia about the revolving axis. By changing a revolving speed of the tool magazine 51 according to the moment of inertia about the revolving axis, it is possible to revolve the tool magazine 51 at a sufficient speed while preventing coming-off of the tool 52.

Further, in estimating the tool shape using the tool gravity center position estimation device, an allowable range of the tool shape can be previously set. In this case, when the estimated shape of the tool falls outside the set allowable range, it is possible to display a message indicating that the tool shape falls outside the allowable range on a not illustrated display device or to issue an alarm using light or sound from a not illustrated lamp or speaker. This prevents a tool whose shape falls outside the set allowable range from being forced to operate to thereby prevent occurrence of interfere with the surroundings or occurrence of a failure of the machine due to the interference and to allow an abnormality of the tool or machine to be found in an early stage.

Alternatively, it is possible to display a message indicating that the tool shape falls outside the allowable range on a not illustrated display device or to issue an alarm using light or sound from a not illustrated lamp or speaker, when there occurs a difference equal to or greater than an allowable range between the tool shape data or tool gravity center position data previously estimated and stored and tool shape data or tool gravity center position data newly estimated. Also in this case, it is possible to prevent a tool whose shape falls outside the set allowable range from being forced to operate to thereby prevent occurrence of interfere with the surroundings or occurrence of a failure of the machine due to the interference and to allow an abnormality of the tool or machine to be found in an early stage.

In the present embodiment, two types of tool shape models, including the model constituted by the tool holder portion and columnar portion and model constituted by the tool holder portion, columnar portion, and blade portion have been described; however, the tool shape model is not limited to the above two types. For example, when the type of the tool that can be used is limited, a tool shape model having a high ratio of the common part is used, thereby allowing the tool gravity center position to be estimated more accurately.

The invention claimed is:

1. A tool gravity position estimation device, comprising:
    a data storage unit configured to store moment of inertia of a tool and weight data of the tool;
    a relational expression storage unit configured to store a relational expression between shape data and tool moment of inertia in a predetermined tool shape model and a relational expression between the shape data and tool weight data in the predetermined tool shape model;
    a calculation unit configured to calculate a value of the shape data based on the tool moment of inertia and tool weight data stored in the data storage unit and the relational expressions stored in the relational expression storage unit;
    a tool shape estimation unit configured to estimate a shape of the tool from the shape data value calculated by the calculation unit; and
    a tool gravity center position calculation unit configured to calculate a gravity center position of the tool based on the tool shape estimated by the tool shape estimation unit.

2. The tool gravity position estimation device according to claim 1, the tool shape model includes a tool holder portion which is a common part of a plurality of tools to be modeled and a columnar portion different in diameter and height for each tool to be modeled.

3. The tool gravity position estimation device according to claim 1, the tool shape model includes a tool holder portion which is a common part of a plurality of tools to be modeled, a columnar portion different in diameter and height for each tool to be modeled, and a blade portion different in shape for each tool to be modeled, and the tool gravity position estimation device is further configured to,
    calculate the shape data value of the tool shape model based on tool length and tool diameter data of the tool in addition to the tool moment of inertia and tool weight data.

4. A machine tool provided with a spindle and a spindle motor for rotating the spindle, comprising:

a machine tool data storage unit configured to store moment of inertia of the spindle of the machine tool;

a torque detection unit configured to detect a load torque of the spindle motor;

an angular acceleration detection unit configured to detect an angular acceleration of rotation of the spindle;

a tool moment of inertia estimation unit configured to estimate moment of inertia of a tool, by subtracting the moment of inertia of the spindle to which the tool is not attached, stored in the machine tool data storage unit, from moment of inertia of the spindle to which the tool is attached, estimated based on the load torque detected by the torque detection unit and angular acceleration detected by the angular acceleration detection unit;

a data storage unit configured to store weight data of the tool and the moment of inertia of the tool;

a relational expression storage unit configured to store a relational expression between shape data and tool moment of inertia in a predetermined tool shape model and a relational expression between the shape data and tool weight data in the predetermined tool shape model;

a calculation unit configured to calculate a value of the shape data based on the tool moment of inertia and tool weight data stored in the data storage unit and the relational expressions stored in the relational expression storage unit;

a tool shape estimation unit configured to estimate a shape of the tool from the shape data value calculated by the calculation unit; and a tool gravity center position calculation unit configured to calculate a gravity center position of the tool based on the tool shape estimated by the tool shape estimation unit.

5. The machine tool according to claim 4, the tool shape model includes a tool holder portion which is a common part of a plurality of tools to be modeled and a columnar portion different in diameter and height for each tool to be modeled.

6. The machine tool according to claim 4, the tool shape model includes a tool holder portion which is a common part of a plurality of tools to be modeled, a columnar portion different in diameter and height for each tool to be modeled, and a blade portion different in shape for each tool to be modeled, and the machine tool is configured to, calculate the shape data value of the tool shape model based on tool length and tool diameter data of the tool in addition to the tool moment of inertia and tool weight data.

7. The machine tool according to claim 4, including a tool magazine configured to hold, at tool holding portions thereof, a plurality of tools to be attached/detached to/from the spindle, the tool holding portions are assigned with identification symbols identifiable from each other, and the machine tool further comprising a tool shape data storage unit configured to store therein the tool shape estimated by the tool shape estimation unit in association with the identification symbol.

8. The machine tool according to claim 4, including a tool magazine configured to hold, at tool holding portions thereof, a plurality of tools to be attached/detached to/from the spindle, the tool holding portions are assigned with identification symbols identifiable from each other, and the machine tool further comprising a tool gravity center position data storage unit configured to store therein the tool gravity center position calculated by the tool gravity center position calculation unit in association with the identification symbol.

9. The machine tool according to claim 4, configured to display a message or issue an alarm when the tool shape estimated by the tool shape estimation unit falls outside a prescribed shape range.

10. The machine tool according to claim 4, comprising:

a tool shape comparison unit configured to compare the tool shape estimated by the tool shape estimation unit with the tool weight data and tool moment of inertia stored in the data storage unit; and the machine tool is further configured to display a message or issue an alarm when a difference obtained as a result of the comparison by the tool shape comparison unit is equal to or larger than a certain value.

\* \* \* \* \*